United States Patent
Kaneko et al.

(10) Patent No.: US 12,237,377 B2
(45) Date of Patent: Feb. 25, 2025

(54) SIC SEMICONDUCTOR SUBSTRATE, AND, PRODUCTION METHOD THEREFOR AND PRODUCTION DEVICE THEREFOR

(71) Applicants: KWANSEI GAKUIN EDUCATIONAL FOUNDATION, Hyogo (JP); TOYOTA TSUSHO CORPORATION, Nagoya (JP)

(72) Inventors: Tadaaki Kaneko, Hyogo (JP); Koji Ashida, Hyogo (JP); Tomoya Ihara, Hyogo (JP); Daichi Dojima, Hyogo (JP)

(73) Assignees: KWANSEI GAKUIN EDUCATIONAL FOUNDATION, Hyogo (JP); TOYOTA TSUSHO CORPORATION, Nagoya (JP)

( * ) Notice: Subject to any disclaimer, the term of this patent is extended or adjusted under 35 U.S.C. 154(b) by 750 days.

(21) Appl. No.: 17/291,572

(22) PCT Filed: Nov. 5, 2019

(86) PCT No.: PCT/JP2019/043204
§ 371 (c)(1),
(2) Date: May 5, 2021

(87) PCT Pub. No.: WO2020/095873
PCT Pub. Date: May 14, 2020

(65) Prior Publication Data
US 2021/0399095 A1  Dec. 23, 2021

(30) Foreign Application Priority Data
Nov. 5, 2018 (JP) .................................. 2018-208476

(51) Int. Cl.
*C30B 29/36* (2006.01)
*H01L 21/02* (2006.01)
*H10D 62/832* (2025.01)

(52) U.S. Cl.
CPC .......... *H10D 62/8325* (2025.01); *C30B 29/36* (2013.01); *H01L 21/02263* (2013.01); *H01L 21/02378* (2013.01); *H01L 21/02529* (2013.01)

(58) Field of Classification Search
CPC ......... C30B 23/02; C30B 25/20; C30B 29/36; H01L 21/02263; H01L 21/02378;
(Continued)

(56) References Cited

U.S. PATENT DOCUMENTS

| 5,989,340 A | 11/1999 | Stephani et al. |
| 2006/0014432 A1 | 7/2006 | Sakaguchi et al. |

(Continued)

FOREIGN PATENT DOCUMENTS

| CN | 101536157 | 9/2009 |
| EP | 2056340 A1 | 5/2009 |

(Continued)

OTHER PUBLICATIONS

English Translation of Office Action from Japanese Application No. 2020-556060 dated Feb. 28, 2023.
(Continued)

*Primary Examiner* — Matthew J Song
(74) *Attorney, Agent, or Firm* — Calfee, Halter & Griswold LLP (57) ABSTRACT

An object of the present invention is to provide a SiC semiconductor substrate having a growth layer with a controlled step height, a manufacturing method thereof, and a manufacturing device thereof. The method includes: a growth process that grows a SiC substrate 10 in a SiC—Si
(Continued)

equilibrium vapor pressure environment. In this way, when the SiC substrate 10 is grown in the SiC—Si equilibrium vapor pressure environment, it is possible to provide a SiC semiconductor substrate in which the step height of the growth layer is controlled.

6 Claims, 6 Drawing Sheets

(58) Field of Classification Search
CPC ......... H01L 21/02433; H01L 21/02529; H01L 21/02631; H01L 29/1608
See application file for complete search history.

(56) References Cited

U.S. PATENT DOCUMENTS

| | | |
|---|---|---|
| 2006/0144324 A1 | 7/2006 | Sakaguchi et al. |
| 2012/0103249 A1* | 5/2012 | Gupta ..................... C30B 29/36 117/89 |
| 2013/0062628 A1 | 3/2013 | Das et al. |
| 2015/0354090 A1 | 12/2015 | Tomita et al. |
| 2019/0136409 A1* | 5/2019 | Kaneko ............. H01L 21/02631 |

FOREIGN PATENT DOCUMENTS

| | | |
|---|---|---|
| JP | H11-087257 A | 3/1999 |
| JP | 2009-155140 A | 7/2009 |
| JP | 2009256138 A | 11/2009 |
| JP | 2011-233780 A | 11/2011 |
| JP | 2011219298 A | 11/2011 |
| JP | 2013034007 A | 2/2013 |
| JP | 2013216554 A | 10/2013 |
| JP | 2015012124 A | 1/2015 |
| WO | 96/17113 A1 | 6/1996 |
| WO | 2014/125550 A1 | 8/2014 |
| WO | 2017188382 A1 | 11/2017 |
| WO | WO-2017188381 A1 * | 11/2017 ............. C30B 23/02 |

OTHER PUBLICATIONS

Kojima et al."Influence of Vicinal Off Angle on Surface Morphology of 4H-SiC Homoepitaxial Layer" Journal of the Surface Science Society of Japan, vol. 35, No. 2, pp. 78-83 (2014).
Shida et al."Investigation of giant step bunching in 4H-SiC homoepitaxial growth: Proposal of cluster effect model" Japanese Journal of Applied Physics, 54, 061301 (2015).
English Translation of International Search Report from PCT/JP2019/043204 dated Jan. 28, 2020 (2 pages).
English translation of Office Action from Chinese Application No. 201980072707.4 dated Mar. 28, 2023.
Extended European Search Report from European Application No. 19881264.6 dated Jun. 14, 2022 (8 pages).
English translation of Office Action from Japanese patent application No. 2020-556060 dated Sep. 20, 2023 (4 pages).
Fuma Hiroo et al."SiC Semiconductor", Toyota Central R&D Labs., Inc., R&D Review (1995) vol. 30, No. 2, pp. 57-67.
A. S. Segal et al."Growth of silicon carbide by sublimation sandwich method in the atmosphere of inert gas" Journal of Crystal Growth (2000) vol. 208, pp. 431-441.

* cited by examiner

SIC SEMICONDUCTOR SUBSTRATE, AND, PRODUCTION METHOD THEREFOR AND PRODUCTION DEVICE THEREFOR

CROSS-REFERENCE TO RELATED APPLICATIONS

This application is a 371 of PCT Application No. PCT/JP2019/043204 filed on Nov. 5, 2019, which claims priority to Japanese Application No. 2018-208476, filed on Nov. 5, 2018, the contents of which are hereby incorporated by reference as if recited in their entirety.

TECHNICAL FIELD

The present invention relates to a SiC semiconductor substrate having a growth layer with a controlled step height, a manufacturing method thereof, and a manufacturing device thereof.

BACKGROUND ART

Since SiC (silicon carbide) semiconductor devices are capable of higher withstand voltage, higher efficiency, and higher temperature operation than Si (silicon) or GaAs (gallium arsenide) semiconductor devices, development is underway for industrialization.

Usually, a step-terrace structure is formed on the surface of a SiC substrate provided with a slight inclination from (0001) used for device manufacturing. Conventionally, in the surface control of the SiC substrate, it has been regarded as a problem that steps are bundled (bunching) during a device manufacturing process to form step bunching.

This step bunching is known to adversely affect the characteristics of SiC semiconductor devices. Specifically, there are known (1) a case where when epitaxial growth is conducted on the surface on which step bunching is formed, the defects due to the step bunching may occur on the surface of the epitaxial growth layer (hereinafter referred to as epi layer) and (2) a case where in the SiC semiconductor devices such as a MOSFET manufactured by forming an oxide film on the surface of the epi layer, the presence of step bouncing has a fatal effect on the operating performance and reliability.

Various techniques for suppressing the occurrence of the step bunching have been proposed for such a problem. For example, Patent Literature 1 describes a "technique which provides a step bunching-free SiC epitaxial wafer by simultaneously supplying an amount of $SiH_4$ gas and $C_3H_8$ gas required for epitaxial growth of SiC at a concentration ratio of C/Si of 0.7 to 1.2 on the gas-etched surface of the SiC single crystal substrate with a 'lattice disorder layer' of 3 nm or less in a chemical vapor deposition (CVD) method".

CITATION LIST

Patent Literature

Patent Literature 1: JP 2013-34007 A

SUMMARY OF INVENTION

Technical Problem

Incidentally, when the problem of step bunching in (1) and (2) described above is further advanced, it is desirable to control the height of the step formed on the surface of the SiC substrate to provide a surface preferable for device manufacturing. That is, when the step height is controlled, it is possible to contribute to the problems caused by the step-terrace structure in epitaxial growth and oxide film formation, and as a result, it is possible to improve the operating performance and reliability of the device.

However, the technique described in Patent Literature 1 is a growth method which suppresses the occurrence of step bunching but is not capable of controlling the step height of the surface of the SiC substrate.

An object of the present invention is to provide a SiC semiconductor substrate having a growth layer with a controlled step height, a manufacturing method thereof, and a manufacturing device thereof.

Solution to Problem

In order to solve the above problems, the manufacturing method of SiC semiconductor substrates according to one aspect of the present invention includes: a growth process that grows a SiC substrate in a SiC—Si equilibrium vapor pressure environment.

In this way, when the SiC substrate is grown in the SiC—Si equilibrium vapor pressure environment, it is possible to provide a SiC semiconductor substrate in which the step height of the growth layer is controlled.

In the aspect, in the growth process, the SiC substrate is arranged and grown in a supplying space for source material which is evacuated through a Si vapor pressure space.

In this way, the supplying space for source material is evacuated (vacuumed) through the Si vapor pressure space, so that the SiC—Si equilibrium vapor pressure environment in the supplying space for source material can be maintained for a long time.

In the growth process, a supplying source for Si atom and a supplying source for C atom are arranged for growth such that an atomic number ratio Si/C in the supplying space for source material exceeds 1.

With such an atomic number ratio Si/C, the supplying source for Si atom and the supplying source for C atom are arranged so that the SiC—Si equilibrium vapor pressure environment can be easily formed in the supplying space for source material.

In the aspect, the growth process is performed at a temperature of 1600° C. or higher.

In this way, with growth in such a temperature range, the SiC substrate can be grown at high speed.

The present invention also relates to a SiC semiconductor substrate. That is, the SiC semiconductor substrate according to one aspect of the present invention includes a growth layer in which steps having a height of one unit cell are arranged.

In this way, the arrangement of the steps having a height of one unit cell contributes to solving the problem of defects due to the step bunching during epitaxial growth and the problem due to the step-terrace structure in MOSFETs or the like. As a result, the operating performance and reliability can be improved.

In the aspect, it is characterized in that the growth layer is 4H—SiC.

The present invention also relates to a manufacturing device of the above-described SiC semiconductor substrate. That is, the manufacturing device of the SiC semiconductor substrate according to one aspect of the present invention includes: a supplying space for source material for supplying Si atoms and C atoms to a SiC substrate for growth; a Si vapor pressure space in which a Si vapor pressure environment is formed; and a high-temperature vacuum furnace capable of heating the supplying space for source material. The supplying space for source material is evacuated through the Si vapor pressure space.

In this way, the supplying space for source material is evacuated (vacuumed) through the Si vapor pressure space, so that the atomic number ratio Si/C preferable for growth can be maintained for a long time in the supplying space for source material.

In the aspect, the supplying space for source material has a supplying source for Si atom and a supplying source for C atom, and the supplying source for Si atom and the supplying source for C atom are arranged such that an atomic number ratio Si/C in the supplying space for source material exceeds 1.

With such a configuration, the SiC—Si equilibrium vapor pressure environment can be formed in the supplying space for source material.

In the aspect, a temperature gradient is provided in the supplying space for source material such that a temperature decreases toward the SiC substrate.

By providing such a temperature gradient, Si atoms and C atoms can be transported to the SiC substrate, and the growth rate can be improved.

In the aspect, the manufacturing device further includes: a source material container which has the supplying space for source material; and a carburizing container which has the Si vapor pressure space.

In the aspect, the high-temperature vacuum furnace includes a main heating chamber capable of heating the supplying space for source material, a preheating chamber which is connected to the main heating chamber, and a moving unit that moves the supplying space for source material. The moving unit is configured to be movable between the main heating chamber and the preheating chamber.

As described above, the supplying space for source material is configured to be movable from the main heating chamber to the preheating chamber, so that the temperature of the SiC substrate can be raised and lowered rapidly.

The present invention also relates to method of arranging steps on a surface of a SiC semiconductor substrate. That is, the method of arranging steps on a surface of a SiC semiconductor substrate according to one aspect of the present invention is a manufacturing method of SiC semiconductor substrates which includes a growth process of growing a SiC substrate. The method includes a growth process that grows the SiC substrate in a SiC—Si equilibrium vapor pressure environment and in which steps having a height of one unit cell are arranged on a surface of the SiC semiconductor substrate.

In the aspect, in the growth process, a supplying source for Si atom and a supplying source for C atom are arranged for growth such that an atomic number ratio Si/C in a supplying space for source material exceeds 1.

Advantageous Effects of Invention

According to the disclosed technique, it is possible to provide a SiC semiconductor substrate having a growth layer with a controlled step height, a manufacturing method thereof, and a manufacturing device thereof.

Other issues, features and advantages will become apparent by reading the embodiments described below for carrying out the invention as taken up with drawings and claims.

DESCRIPTION OF EMBODIMENTS

Hereinafter, a preferred embodiment of the present invention illustrated in the drawings will be described in detail with reference to FIGS. 1 to 7. The technical scope of the present invention is not limited to the embodiments shown in the accompanying drawings, and can be appropriately changed within the scope described in the claims.

[Manufacturing Method of SiC Semiconductor Substrates]

Hereinafter, a manufacturing method of SiC semiconductor substrates according to one embodiment of the present invention will be described in detail.

The manufacturing method of SiC semiconductor substrates according to the present invention includes a growth process of growing a SiC substrate 10 in a SiC—Si equilibrium vapor pressure environment. In this way, when the SiC substrate 10 is grown in the SiC—Si equilibrium vapor pressure environment, it is possible to manufacture a SiC semiconductor substrate having a growth layer 11 in which the height of a step 12 is controlled.

<Sic Substrate>

As the SiC substrate 10, any polytype can be used. As the substrate of the SiC semiconductor device, the SiC substrate 10 is used which is processed from the bulk crystal produced by a sublimation method or the like.

In the description in this specification, the surface (specifically, the surface on which the growth layer 11 will be deposited) of the SiC substrate 10 on which the semiconductor element will be formed is referred to as a main surface, and the surface facing the main surface is referred to as a back surface. Further, the main surface and the back surface are collectively referred to as a front surface.

Incidentally, as the main surface, a surface having an off angle of several degrees (for example, 0.4 to 8°) from (0001) surface or (000-1) surface can be exemplified. (Incidentally, in this specification, in the notation of the Miller index, "-" means a bar attached to the index immediately after that).

A step-terrace structure is checked on the surface of the SiC substrate 10 flattened at an atomic level. This step-terrace structure is a staircase structure in which steps 12 which are stepped portions of one or more molecular layers and terraces 13 which are flat portions where {0001} surface is exposed are arranged alternately.

In the step 12, one molecular layer (0.25 nm) is the minimum height (minimum unit), and various step heights are formed by overlapping a plurality of the single molecular layers. In the description of this specification, the steps 12 are bundled (bunched) to become huge and have a height exceeding one unit cell of each polytype, which is called a macro step bunching (MSB).

That is, the MSB is the steps 12 which are bunched beyond four molecular layers (five or more molecular layers) in the case of 4H—SiC and the steps 12 which are bunched beyond six molecular layers (seven or more molecular layers) in the case of 6H—SiC.

The defect due to the MSB occurs on the surface of the epi layer, and the defect is one of the factors that hinder the reliability of the oxide film of the MOSFET. Thus, it is desirable that this MSB is not formed on the surface of the SiC substrate 10.

<Growth Process>

In the growth process according to the embodiment of the present invention, the growth layer 11 in which the MSB is not formed can be grown on the SiC substrate 10 on which the MSB is formed by conducting growth in the SiC—Si equilibrium vapor pressure environment. (see FIG. 1).

In this growth process, a sublimation method can be adopted. The sublimation method is a method in which a source material and a SiC substrate 10 are arranged and heated in a supplying space for source material S1 (growth space) so that a source material gas to which the source material is sublimated is transported on the SiC substrate 10 for recrystallization and growth.

That is, in addition to the SiC substrate 10, a supplying source for Si atom and a supplying source for C atom as source materials are arranged in the supplying space for source material S1, and Si atoms and C atoms which are the source materials of the SiC substrate 10 are supplied into the supplying space for source material S1 by heating the sources. The Si atoms and C atoms are transported to the surface of the SiC substrate 10 and recrystallized, so that the growth layer 11 is formed.

Further, in the growth process according to the embodiment of the present invention, it is desirable that the SiC substrate 10 is arranged in the supplying space for source material S1 evacuated (vacuumed) through a Si vapor pressure space S2. That is, as illustrated in FIG. 2(a), it is desirable that a source material container 20 having the supplying space for source material S1 is arranged in a carburizing container 30 having the Si vapor pressure space S2, and the SiC substrate 10 is further arranged in the source material container 20.

The source material container 20 includes an upper container 21 and a lower container 22 which can be fitted to the upper container 21 and has the supplying space for source material S1 for growing the SiC substrate 10 in the container. At this time, a minute gap 23 is formed in the fitting portion between the upper container 21 and the lower container 22, and the inside of the source material container 20 is evacuated (vacuumed) through the gap 23.

As the supplying source for Si atom and the supplying source for C atom, a material capable of supplying Si atoms such as a Si substrate, a material capable of supplying C atoms such as graphite, and a material capable of supplying Si atoms and C atoms such as a SiC substrate can be adopted. Further, by forming at least a part of the source material container 20 with polycrystalline SiC (Poly-SiC), the source material container 20 itself can be used as a supplying source for Si atom and a supplying source for C atom.

FIG. 2(a) illustrates an aspect in which the source material container 20 made of polycrystalline SiC is adopted, and the Si substrate 24 is arranged in the supplying space for source material S1. In this case, the source material container 20 and the Si substrate 24 supply Si atoms into the supplying space for source material S1, and the source material container 20 supplies C atoms.

The arrangement of the supplying source for Si atom and the supplying source for C atom is not limited to this aspect, and any aspect may be used as long as the Si atom and the C atom can be supplied in the supplying space for source material S1. For example, a material other than polycrystalline SiC may be adopted for the source material container 20, and an aspect may be adopted in which a Si material, a C material, and a SiC material are arranged in the supplying space for source material S1.

Incidentally, in a case where polycrystalline SiC is used as the source material, the vapor pressure difference (chemical potential difference) between the polycrystalline SiC (source material) and the single crystal SiC (SiC substrate 10) can be used as a growth driving force.

It is desirable that a temperature gradient is provided in the supplying space for source material Si so that the temperature decreases toward the SiC substrate 10. This temperature gradient is used as the growth driving force to cause Si atoms and C atoms to be the transported to the SiC substrate 10, so that the growth rate of the growth layer 11 increases.

In order to efficiently cause the Si atoms and the C atoms to reach the SiC substrate 10, the supplying source for Si atom and the supplying source for C atom may be brought close to the SiC substrate 10. FIG. 2(a) illustrates an aspect in which the polycrystalline SiC upper container 21 serving as the supplying source for Si atom and the supplying source for C atom are arranged close to the SiC substrate 10 in parallel.

A distance L between the main surface of the SiC substrate 10 and the top surface of the upper container 21 is preferably set in a range of 0.5 to 20 mm and more preferably in a range of 0.7 to 10 mm.

In a case where this distance L is 0.5 mm or more, a temperature difference between the main surface of the SiC substrate 10 and the top surface of the upper container 21 becomes large. As a result, the growth driving force increases, and the growth rate increases.

On the other hand, in a case where the distance L is 20 mm or less, the distance between the source material and the substrate becomes short, the source material gas is efficiently transported, and the growth rate increases.

As illustrated in FIG. 2(a), the source material container 20 is arranged in the Si vapor pressure space S2 in which the Si vapor pressure environment is formed. In this way, when the supplying space for source material S1 is arranged in the Si vapor pressure space S2, and the inside of the source material container 20 is evacuated (vacuumed) through the space of the Si vapor pressure environment, Si atoms can be suppressed from decreasing from the supplying space for source material S1. Accordingly, the atomic number ratio Si/C which is preferable for growth can be maintained for a long time in the supplying space for source material S1.

That is, in a case where evacuation is directly made from the supplying space for source material S1, Si atoms are exhausted from the gap 23. In this case, the atomic number ratio Si/C in the supplying space for source material S1 is significantly reduced, so that an environment suitable for growth is not maintained.

On the other hand, in a case where the inside of the source material container 20 is evacuated through the Si vapor pressure space S2 in the Si vapor pressure environment, Si atoms is suppressed from being exhausted from the supplying space for source material S1, so that the atomic number ratio Si/C in the supplying space for source material S1 can be maintained.

For the Si vapor pressure space S2, it is sufficient that the Si vapor pressure environment is formed at the time of heating, and for example, the Si vapor pressure environment can be formed by using the carburizing container 30.

The carburizing container 30 may have an aspect capable of housing the source material container 20 in the Si vapor pressure space S2, and includes, for example, an upper container 31 and a lower container 32 which can be fitted into the upper container 31. Similarly to the source material container 20, in the carburizing container 30, a minute gap 33 is formed in the fitting portion between the upper container 31 and the lower container 32, and evacuation (vacuum) is made through the gap 33.

The inner wall surface of the carburizing container 30 is configured by a plurality of layers and has a tantalum silicide layer ($TaSi_2$, $Ta_5Si_3$, or the like), a tantalum carbide layer (TaC or $Ta_2C$), and a tantalum layer (Ta) in this order from the inside of the Si vapor pressure space S2 to the outside.

As described above, the tantalum silicide layer, the tantalum carbide layer, and the tantalum layer are formed from the inside, so that C atoms existing in the Si vapor pressure space S2 can be taken (carburized) into the carburizing container 30 itself. Further, the tantalum silicide layer supplies Si atoms into the Si vapor pressure space S2 of the carburizing container 30 by heating. As a result, a high-purity Si vapor pressure environment (Si atmosphere) can be formed in the Si vapor pressure space S2 during heating.

Incidentally, when the Si vapor pressure environment can be formed in the Si vapor pressure space S2 by taking in C atoms, it can be adopted as the carburizing container 30.

It is desirable that the source material container 20 and the carburizing container 30 are formed to have such a diameter that can house a 6-inch wafer or an 8-inch wafer.

FIG. 2(b) is an explanatory diagram illustrating an outline of a growth mechanism. By heating the supplying space for source material S1 in which the SiC substrate 10 is arranged in a temperature range of 1400° C. or higher and 2300° C. or lower, the following reactions 1) to 5) are continuously carried out, and as a result, it is considered that growth proceeds.

1) Poly-SiC(s)→Si(v)+C(s)
2) 2C(s)+Si(v)→$SiC_2$(v)
3) C(s)+2Si(v)→$Si_2C$(v)
4) Si(v)+$SiC_2$(v)→2SiC(s)
5) $Si_2C$(v)→Si(v)+SiC(s)

Explanation of 1): When the source material container 20 (Poly-SiC(s)) is heated, Si atoms (Si(v)) are desorbed from SiC by thermal decomposition.

Explanation of 2) and 3): C(C(s)) remaining due to desorption of Si atom (Si(v)) reacts with Si vapor (Si(v)) in the supplying space for source material S1 and thus is sublimated as $SiC_2$C, $SiC_2$, or the like into the supplying space for source material S1.

Explanation of 4) and 5): The sublimated $Si_2C$, $SiC_2$, or the like reaches (diffuse) the terrace 13 of the SiC substrate 10 due to the temperature gradient (and the chemical potential difference) and reaches the step 12, so that growth is conducted with taking over the polymorphism of the underlying SiC substrate 10 and growing (step flow growth).

The growth environment in the growth process according to the embodiment of the present invention is characterized by a SiC—Si equilibrium vapor pressure environment. Hereinafter, the SiC—Si equilibrium vapor pressure environment and the SiC—C equilibrium vapor pressure environment will be described in detail. Incidentally, the SiC—Si equilibrium vapor pressure environment and the SiC—C equilibrium vapor pressure environment in this specification include a near thermal equilibrium vapor pressure environment that satisfies a relationship between the growth rate and the growth temperature derived from a theoretical thermal equilibrium environment.

The SiC—Si equilibrium vapor pressure environment refers to the environment of vapor pressure when three phases of SiC (solid phase), Si (liquid phase), and a gas phase are in equilibrium.

In other words, the "SiC—Si vapor pressure environment" in this specification refers to the environment of vapor pressure when SiC (solid) and Si (liquid phase) are in phase equilibrium state through a gas phase.

The SiC—Si equilibrium vapor pressure environment is formed, for example, by heat-processing a semi-closed space having an atomic number ratio Si/C exceeding 1. Specifically, in a case where the SiC substrate 10 that satisfies the stoichiometric ratio 1:1 and the Si vapor supply source (Si substrates, Si pellets, or the like) are arranged in the SiC source material container 20 that satisfies the stoichiometric ratio 1:1, the atomic number ratio Si/C in the source material container 20 exceeds 1.

Incidentally, the term "semi-closed space" in this specification refers to a space in which the inside of the container can be vacuumed, but at least a part of the vapor generated in the container can be confined. This semi-closed space can be formed in the source material container 20 or the carburizing container 30.

The SiC—C equilibrium vapor pressure environment refers to the environment of vapor pressure when three phases of SiC (solid phase), C (solid phase), and a gas phase are in equilibrium.

In other words, the "SiC—C equilibrium vapor pressure environment" in this specification refers to the environment of vapor pressure when SiC (solid phase) and C (solid phase) are in phase equilibrium state through a gas phase.

The SiC—C equilibrium vapor pressure environment is formed, for example, by heat-processing a semi-closed space having an atomic number ratio Si/C of 1 or less. Specifically, in a case where the SiC substrate 10 that satisfies the stoichiometric ratio 1:1 is arranged in the SiC source material container 20 that satisfies the stoichiometric ratio 1:1, the atomic number ratio Si/C in the source material container 20 becomes 1. Further, a C vapor supply source (C pellets or the like) may be arranged to set the atomic number ratio Si/C to 1 or less.

The atomic number ratio Si/C in the gas phase of the SiC—Si equilibrium vapor pressure environment is larger than the atomic number ratio Si/C in the gas phase of the SiC—C equilibrium vapor pressure environment.

In this method, under the condition that the vapor pressure environment between the SiC source material and the SiC substrate becomes the SiC—Si equilibrium vapor pressure environment, the vapor pressure difference (chemical potential difference) between the polycrystalline SiC (SiC source material) and the single crystal SiC (SiC substrate 10) or the temperature gradient is used as the growth driving force to grow the SiC substrate 10.

Herein, in a case where the vapor pressure difference between the SiC source material and the SiC substrate is used as the growth amount, the growth rate of SiC can be obtained by the following equation 1.

$$\text{GROWTH RATE(m/s)} \propto \sum_{i=SiC, Si_2C, SiC_2} \frac{(P_{SOURCE\ MATERIALi} - P_{SUBSTRATEi})}{\sqrt{2\pi m_i kT}} \quad \text{[Equation 1]}$$

Herein, T is a temperature on the SiC source material side, $m_i$ is the mass of one molecule of a gas phase species ($Si_xC_y$), and k is the Boltzmann constant.

Further, the $P_{source\ materiali} - P_{substratei}$ is the amount of growth precipitated as SiC when the source material gas becomes supersaturated, and SiC, $SiC_2C$, and $SiC_2$ are assumed as the source material gas.

The SiC—Si equilibrium vapor pressure environment can be formed by arranging and heating the supplying source for Si atom and the supplying source for C atom so that the atomic number ratio Si/C in the supplying space for source material S1 exceeds 1.

a. Hereinafter, the arrangement of the supplying space for source material S1 for forming the SiC—Si equilibrium vapor pressure environment will be described in detail.

In this method, the SiC—Si equilibrium vapor pressure environment can be formed by arranging the supplying source for Si atom and the supplying source for C atom so that the atomic number ratio Si/C in the supplying space for source material S1 exceeds is 1. On the other hand, the SiC—C equilibrium vapor pressure environment is formed by the arrangement in which the atomic number ratio Si/C in the supplying space for source material S1 is 1 or less.

That is, when more supplying source for Si atoms than the supplying source for C atoms are arranged in the supplying space for source material S1 before heating, the SiC—Si equilibrium vapor pressure environment can be formed in the supplying space for source material S1.

Incidentally, although the Si substrate 24 is described as the supplying source for Si atom, of course, any material may be adopted as long as Si atoms are supplied to increase the atomic number ratio Si/C in the supplying space for source material S1.

On the other hand, the SiC—C equilibrium vapor pressure environment can be formed by arranging and heating the supplying source for Si atom and the supplying source for C atom so that the atomic number ratio Si/C in the supplying space for source material S1 is 1 or less.

FIG. 3(a) illustrates an aspect in which only the SiC substrate 10 is arranged in the source material container 20 made of SiC.

The heating temperature in this method is preferably set in a range of 1400 to 2200° C., and more preferably set in a range of 1600 to 2000° C.

Figure 2:
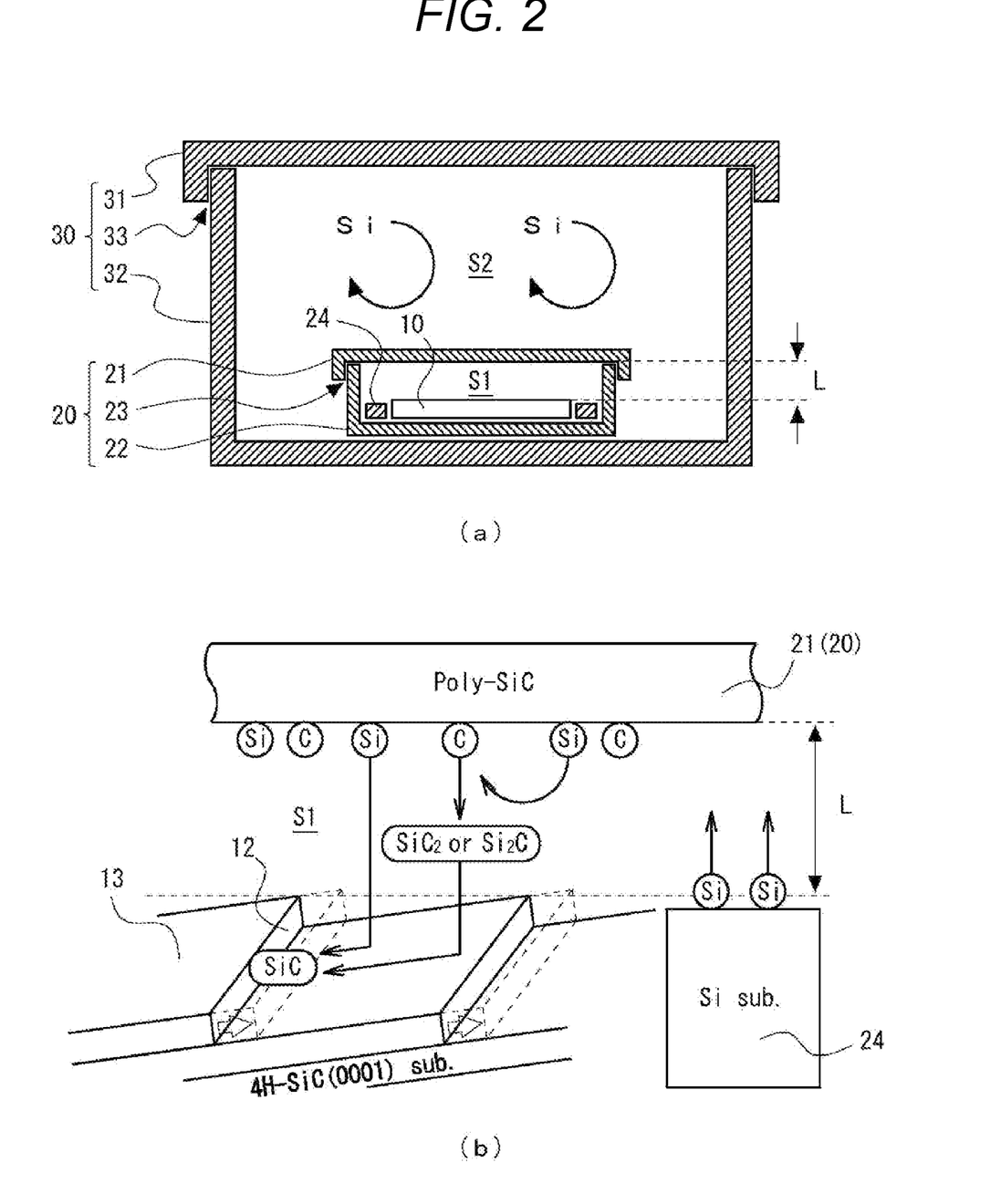
FIG. 2 is an explanatory diagram of the growth process of the manufacturing method of SiC semiconductor substrates according to one embodiment.
Figure 3:
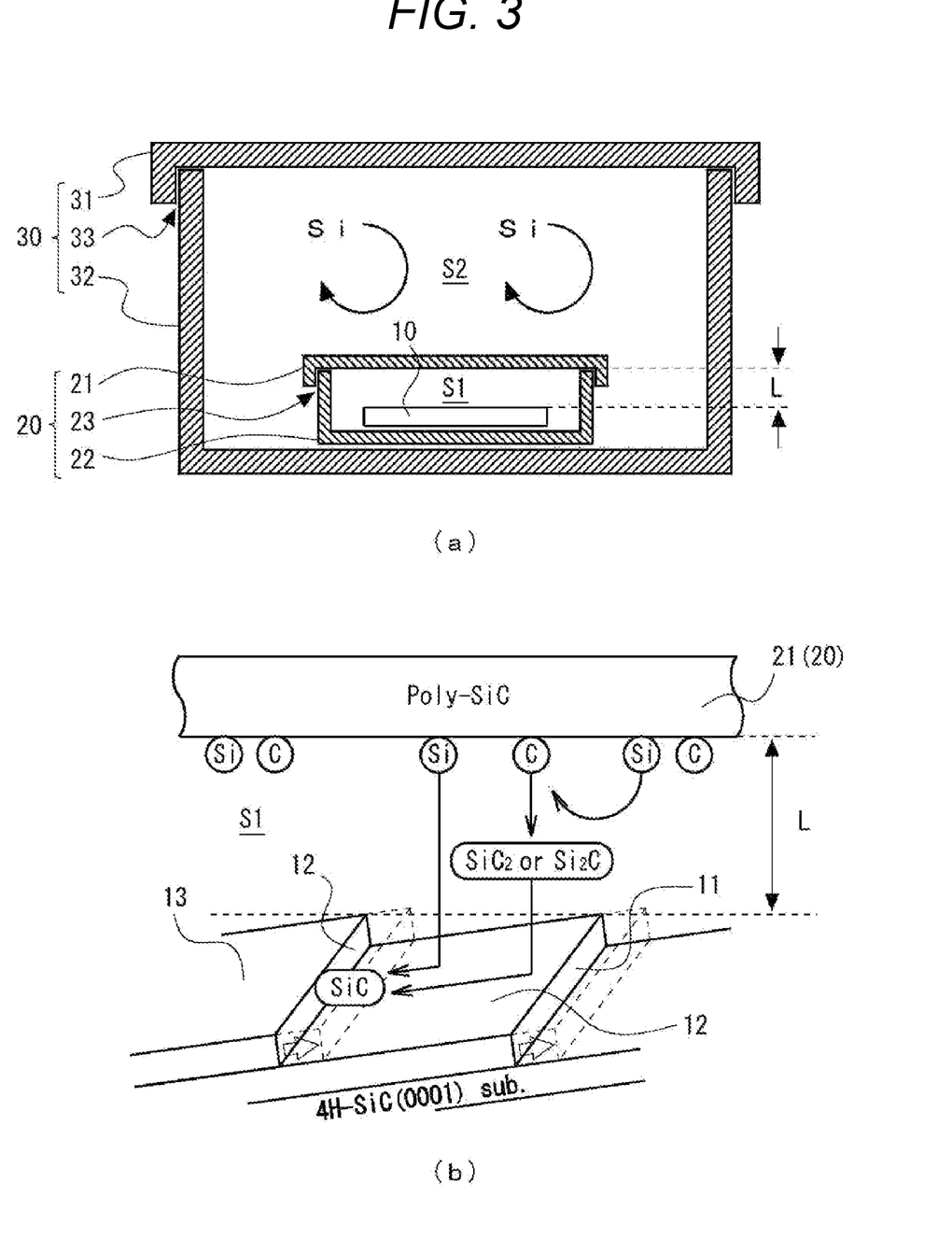
FIG. 3 is an explanatory diagram of the growth process of the manufacturing method of SiC semiconductor substrates according to one embodiment.

In the aspects of FIGS. 2 and 3, the equilibrium vapor pressure of Si atoms and C atoms is generated from the supplying source for Si atom and the supplying source for C atom according to the heating temperature and fills the supplying space for source material S1.

The growth rate in this method can be controlled by the above temperature range and can be selected in a range of 0.001 to 1 μm/min.

The amount of growth in this method is preferably 5 to 15 μm and more preferably 8 to 10 μm.

The growth time in this method can be set to an arbitrary time so as to achieve a desired growth amount. For example, in a case where the growth amount is desired to be 10 μm at the growth rate of 10 nm/min, the growth time may be 100 minutes.

The vacuum degree in this method (main heating chamber 41) is $10^{-5}$ to 10 Pa ad more preferably $10^{-3}$ to 1 Pa.

In this method, it is also possible to introduce an inert gas during growth. Ar or the like can be selected for this inert gas, and the vacuum degree of the high-temperature vacuum furnace 40 (main heating chamber 41) can be adjusted by introducing this inert gas in a range of $10^{-5}$ to 10000 Pa.

The manufacturing method of SiC semiconductor substrates according to the present invention includes a growth process of growing the SiC substrate 10 in the SiC—Si equilibrium vapor pressure environment. In this way, when the SiC substrate is grown in the SiC—Si equilibrium vapor pressure environment, it is possible to grow the growth layer 11 in which the steps 12 having the height of one unit cell are arranged.

According to the manufacturing method of SiC semiconductor substrates of the present invention, the SiC substrate 10 is arranged and grown in the supplying space for source material S1 evacuated (vacuumed) through the Si vapor pressure space S2. In this way, the supplying space for source material S1 is evacuated through the Si vapor pressure space S2, so that the SiC—Si equilibrium vapor pressure environment in the supplying space for source material S1 can be maintained for a long time.

Figure 1:
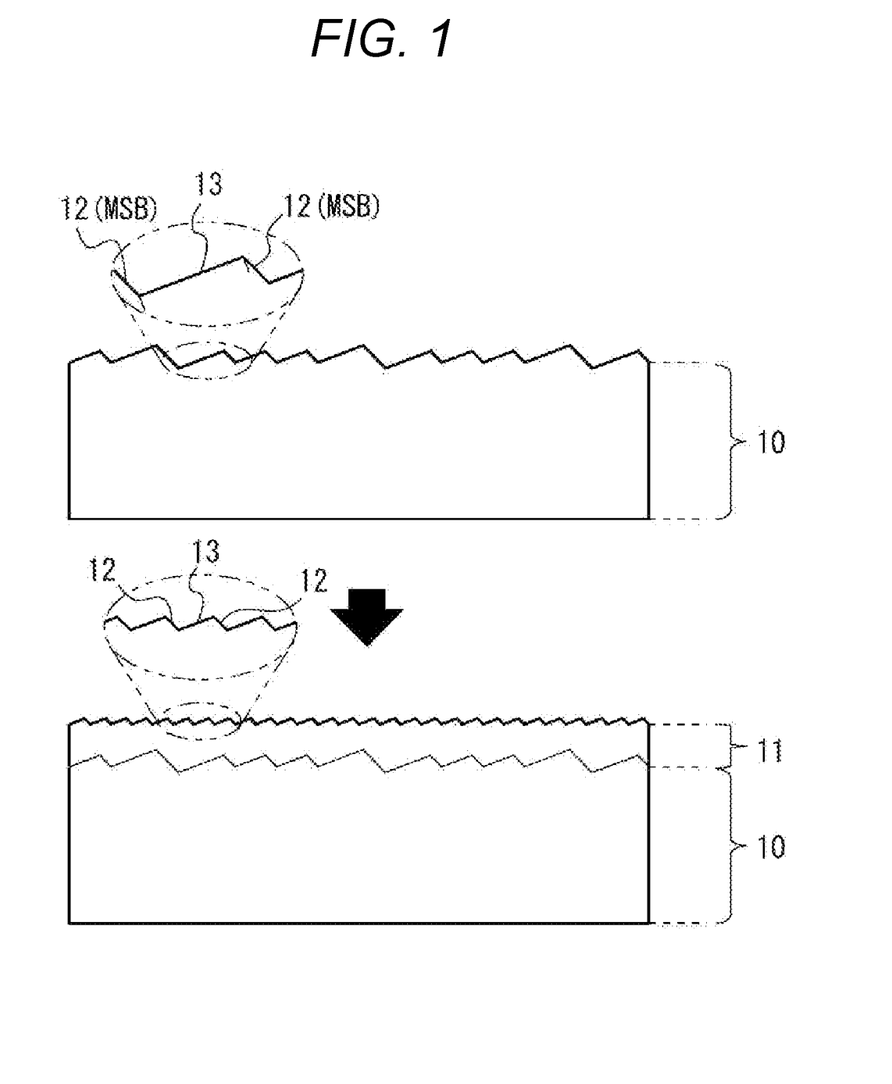
FIG. 1 is an explanatory diagram of a growth process of a manufacturing method of SiC semiconductor substrates according to one embodiment.

Incidentally, although FIG. 1 illustrates an example in which the SiC substrate 10 which does not have the epi layer which is the pressure resistant layer is subjected to the growth process according to the present invention, of course, the SiC substrate 10 which has the epi layer which is the pressure resistant layer also can be subjected to the growth process according to the present invention.

The present invention is a manufacturing method of SiC semiconductor substrates which includes a growth process of growing a SiC substrate. The method includes a growth process that grows a SiC substrate in the SiC—Si equilibrium vapor pressure environment to arrange the steps having the height of one unit cell on the surface of the SiC semiconductor substrate.

For example, the SiC—Si equilibrium vapor pressure environment is formed by arranging the supplying source for Si atom and the supplying source for C atom for growth so that the atomic number ratio Si/C in the supplying space for source material exceeds 1.

[SiC Semiconductor Substrate]

Figure 5:
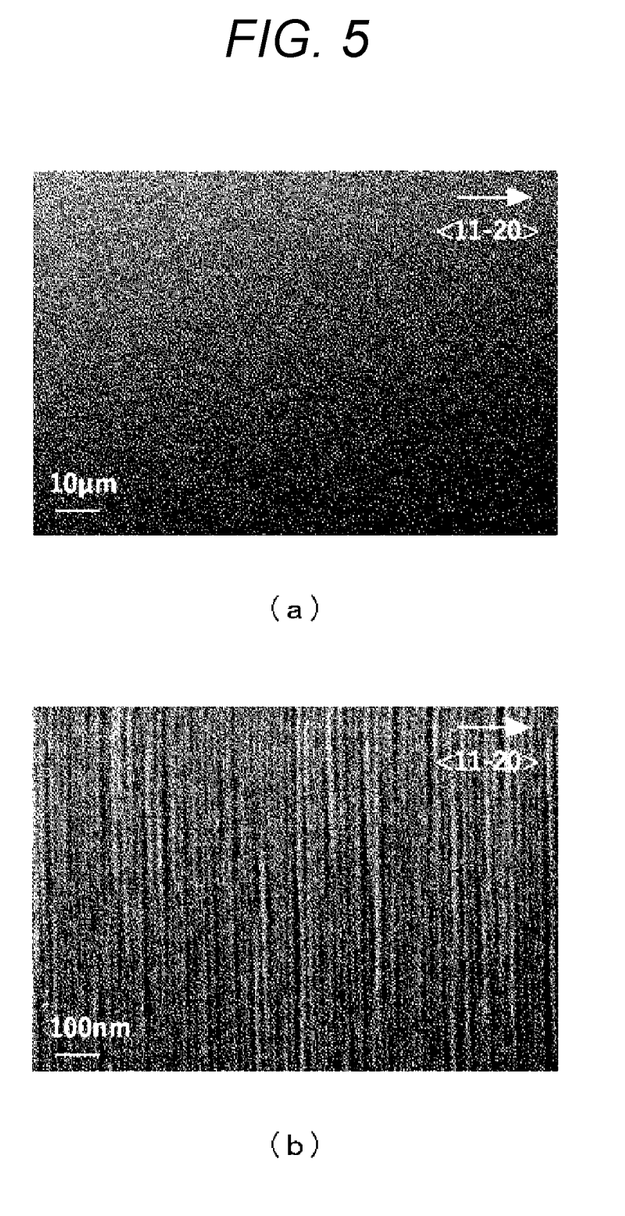
FIG. 5 is an SEM image of a SiC substrate surface observed in Example 1 of the manufacturing method of SiC semiconductor substrates according to one embodiment.

The SiC semiconductor substrate of one embodiment of the present invention is characterized by including the growth layer 11 in which the steps 12 having the height of one unit cell are arranged. As illustrated in FIG. 5, on the surface of the growth layer 11 grown on the 4H—SiC (0001) surface side, the MSB is not formed over a range of 100 μm or more along a <11-20> direction, but the steps 12 having the height of 1 nm (one unit cell) are arranged in a terrace 13 width of 14 nm. Incidentally, the step height and terrace width can be checked by an atomic force microscope (AFM) or a scanning electron microscope (SEM) image contrast evaluation method described in JP 2015-179082 A.

In this way, in a case where the epi layer which is a pressure resistant layer is formed on the growth layer 11 by providing the growth layer 11 in which the height of the step 12 is controlled to one unit cell, it is possible to suppress the occurrence of defects due to the step bunching on the epi layer surface.

Further, in a case where the growth layer 11 is used as a pressure resistant layer, the problems due to the step-terrace structure do not occur in the MOSFET, and as a result, the operating performance and reliability can be improved. That is, it can contribute to the formation of a preferable oxide insulating film.

[Manufacturing Device of SiC Semiconductor Substrates]

Hereinafter, a manufacturing device of SiC semiconductor substrates according to the present invention will be described in detail with reference to FIG. 4. The manufacturing device according to this embodiment includes the carburizing container 30 which has the Si vapor pressure space S2, the source material container 20 which has the supplying space for source material S1, and the high-temperature vacuum furnace 40 which is capable of heating the supplying space for source material S1. Incidentally, in the same embodiment, the same reference signs are given to the components that are basically the same as the above-described SiC semiconductor substrate and the manufacturing method thereof, and the description thereof will be simplified.

Figure 4:
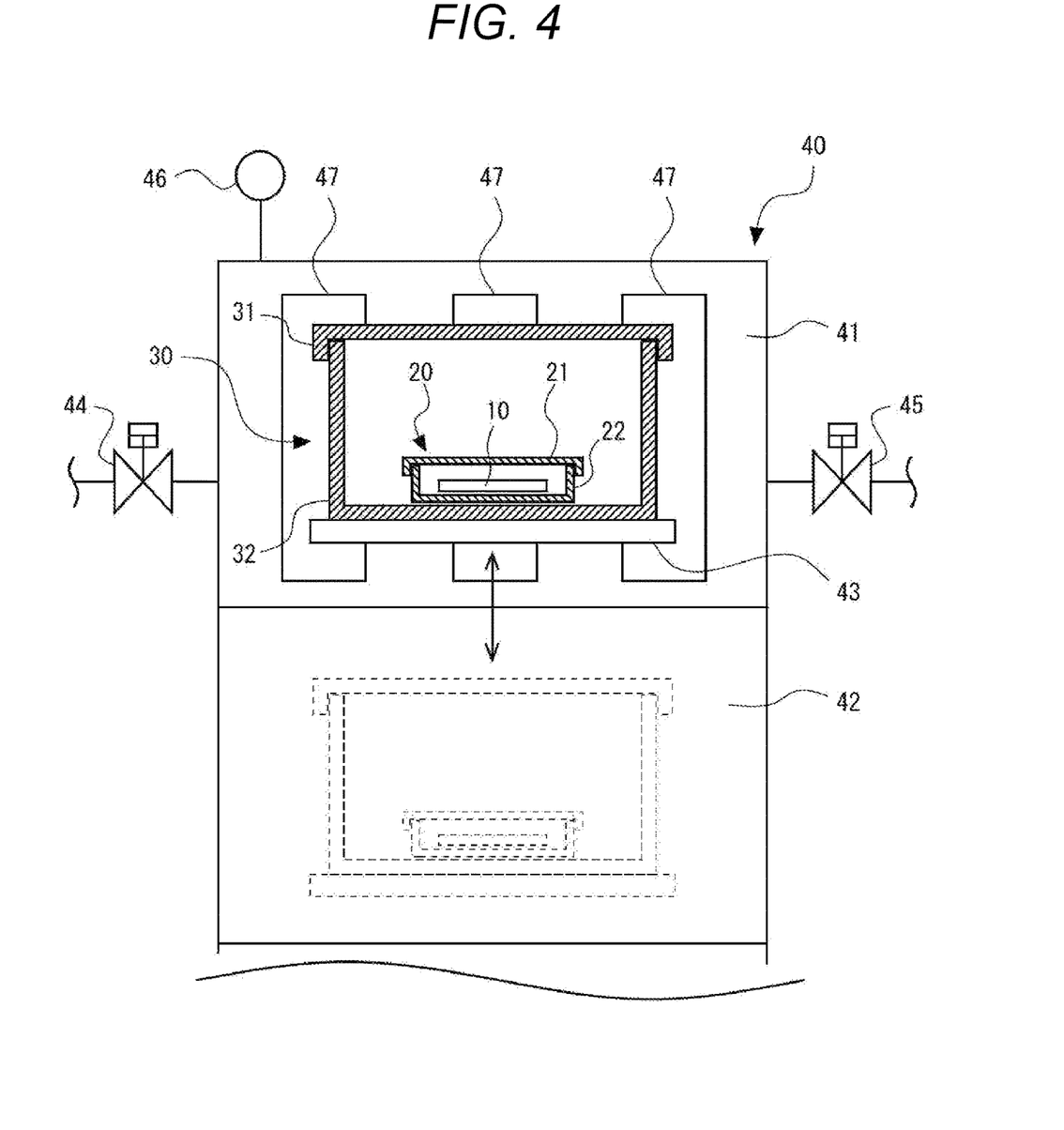
FIG. 4 is a schematic diagram of a high-temperature vacuum furnace used in the manufacturing method of SiC semiconductor substrates according to one embodiment.

FIG. 4 is an example of the high-temperature vacuum furnace 40 (the manufacturing device of SiC semiconductor substrates) used in the growth process of the manufacturing method of SiC semiconductor substrates according to the present invention.

The high-temperature vacuum furnace 40 includes a main heating chamber 41, a preheating chamber 42, and a moving unit 43 (moving table) capable of moving the carburizing container 30 from the preheating chamber 42 to the main heating chamber 41. The main heating chamber 41 can heat the SiC substrate 10 to a temperature of 1000° C. or higher and 2300° C. or lower. The preheating chamber 42 is a space for preheating the SiC substrate 10 before heating in the main heating chamber 41.

A vacuum forming valve 44, an inert gas injection valve 45, and a vacuum gauge 46 are connected to the main heating chamber 41. The vacuum forming valve 44 is connected to a vacuum pump which evacuates and vacuums the inside of the main heating chamber 41, and the vacuum degree in the main heating chamber 41 can be adjusted. Further, by introducing an inert gas (for example, Ar or the like) into the main heating chamber 41, the inert gas injection valve 45 can adjust the pressure. The vacuum gauge 46 can measure the vacuum degree in the main heating chamber 41.

A heater 47 is provided inside the main heating chamber 41. Further, a heat-reflecting metal plate is fixed to the side wall and ceiling of the main heating chamber 41 (not illustrated), and the heat-reflecting metal plate is configured to reflect the heat of the heater 47 toward the substantially central portion of the main heating chamber 41.

Accordingly, the SiC substrate 10 can be heated such that the temperature is raised to 1000° C. or higher to 2300° C. or lower. Incidentally, as the heater 47, for example, a resistance heating type heater or a high-frequency induction heating type heater can be used.

The preheating chamber 42 is configured to be connected to the main heating chamber 41 such that the carburizing container 30 can be moved by the moving unit 43. Accordingly, the supplying space for source material S1 is conveyed from the main heating chamber 41 to the preheating chamber 42 or from the preheating chamber 42 to the main heating chamber 41.

Incidentally, unlike the main heating chamber 41, the preheating chamber 42 is not provided with the heater 47, and the temperature thereof is raised by the residual heat of the main heating chamber 41. For example, in a case where the temperature of the main heating chamber 41 is 2000° C., the preheating chamber 42 is configured such that the temperature is raised to about 1000° C., and degasification processing is performed on the carburizing container 30 and the like.

Since the conveyance between the main heating chamber 41 and the preheating chamber 42 is completed in about 1 minute at the shortest by the moving unit 43, it is possible to raise and decrease the temperature at 1 to 1000° C./min. Since the rapid temperature rise and the rapid temperature decrease can be performed in this way, it is possible to observe a surface shape having no history of low temperature growth during temperature rise and temperature decrease, which is difficult with conventional devices.

Further, in FIG. 5, the preheating chamber 42 is arranged below the main heating chamber 41. However, the present invention is not limited to this, and the preheating chamber 42 may be installed in an arbitrary direction.

The moving unit 43 is a table on which the carburizing container 30 is arranged, and a minute amount of heat is released from the contact portion with the carburizing container 30. Accordingly, a temperature gradient is formed in the carburizing container 30 or in the supplying space for source material S1 to serve as a growth driving force for the SiC substrate 10. As illustrated in FIG. 5, in a case where the carburizing container 30 is supported from below, the temperature gradient is provided such that the temperature decreases toward a bottom surface direction (from top to bottom) of the carburizing container 30.

Incidentally, the temperature gradient can be provided in an arbitrary direction by changing the design of the moving unit 43. For example, in a case where a hanging type or the like is adopted for the moving unit 43, heat is released in an upper direction, and thus in the temperature gradient, a slight temperature gradient is provided such that the temperature decreases toward the top surface direction (from bottom to top) of the carburizing container 30.

According to the present invention, an arrangement process of arranging the SiC substrate 10 in the supplying space for source material S1 evacuated (vacuumed) through the Si vapor pressure space S2 and a growth process of growing the SiC substrate 10 in the SiC—Si equilibrium vapor pressure environment are included.

In this way, when the supplying space for source material S1 for growing the SiC substrate 10 is evacuated (vacuumed) through the Si vapor pressure space S2, it is possible to suppress the exhaustion of Si atoms in the supplying space for source material S1 and maintain the atomic number ratio Si/C in the supplying space for source material S1 at a ratio suitable for growth.

Further, when the SiC substrate 10 is grown in the SiC—Si equilibrium vapor pressure environment, it is possible to suppress the formation of MSB on the surface of the SiC substrate 10. At this time, even in a case where the "lattice disorder layer" exists on the SiC substrate 10, it is possible to suppress the formation of the MSB.

EXAMPLES

The SiC semiconductor substrates of Example 1 and Comparative Example 1 were manufactured by the following methods.

Example 1

(Arrangement Process)

The SiC substrate 10 was arranged in the supplying space for source material S1 and the Si vapor pressure space S2 under the following conditions (see FIG. 2(a)).

[SiC Substrate 10]
  Polymorphism: 4H—SiC
  Off direction and off angle: <11-20> direction 4° off
  Growth surface: (0001) surface
  Substrate size: width 10 mm×length 10 mm×thickness 0.3 mm
  Lattice disorder layer: 5 μm Incidentally, the depth of the lattice disorder layer was checked confirmed by SEM-EBSD. The depth may be checked by TEM and μXRD.

[Supplying Space for Source Material S1]
  Material of source material container 20: Polycrystalline SiC
  Size of source material container 20: diameter 60 mm×height 4 mm
  Si substrate 24: width 10 mm×length 10 mm×thickness 0.2 mm When the Si substrate 24 is arranged in the source material container 20 in this way, the atomic number ratio Si/C in the supplying space for source material S1 is set to exceed 1 (SiC—Si equilibrium vapor pressure environment).

[Si Vapor Pressure Space S2]
  Tantalum silicide layer of carburizing container 30: $TaSi_2$ or $Ta_5Si_3$
  Tantalum carbide layer of carburizing container 30: TaC or $Ta_2C$
  Tantalum layer of carburizing container 30: Ta
  Size of carburizing container 30: diameter 160 mm×height 60 mm (Growth Process)

The SiC substrate 10 arranged under the above conditions was grown under the following conditions.
  Temperature rising rate: 10° C./min
  Heating temperature: 1800° C.
  Heating time: 60 min
  Growth rate: 68 nm/min
  Main heating chamber vacuum degree: $10^{-3}$ Pa
  Temperature drop rate: 1000° C./min FIG. 5 is an SEM image of the surface of the SiC substrate 10 of Example 1 grown under the above conditions. FIG. 5(a) is an SEM image observed at a magnification of ×1000, and FIG. 5(b) is an SEM image observed at a magnification of ×100,000.

The MSB is not formed on the surface of the SiC substrate 10 of Example 1, and the steps 12 of 1.0 nm (full unit cell) are regularly arranged with a terrace 13 width of 14 nm. Incidentally, the height of the step 12 was measured by AFM.

Figure 7:
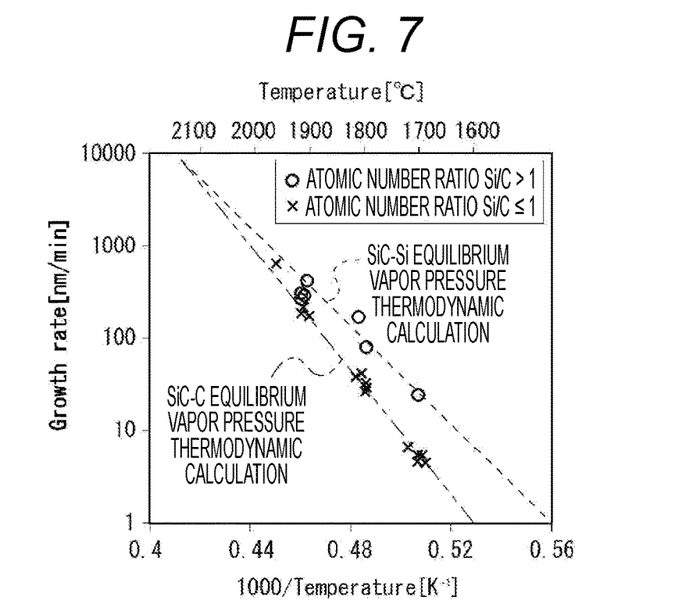
FIG. 7 is a graph illustrating a growth condition in a growth process of a manufacturing method of SiC semiconductor substrates according to one embodiment.

Further, it is known from the relationship between the heating temperature and the growth rate that the growth environment in which the height of the step 12 can be suppressed as in Example 1 is the SiC—Si equilibrium vapor pressure environment (see FIG. 7).

Comparative Example 1

(Arrangement Process)

The SiC substrate 10 was arranged in the supplying space for source material S1 and the Si vapor pressure space S2 under the following conditions (see FIG. 3(a)).

SiC Substrate 10]
The same SiC substrate 10 as in Example 1 was used.

[Supplying Space for Source Material S1]
The same source material container 20 as in Example 1 was used. The Si substrate 24 was not arranged, and only the SiC substrate 10 was arranged in the source material container 20. As a result, the atomic number ratio Si/C in the supplying space for source material S1 is set to be 1 or less (SiC—C equilibrium vapor pressure environment).

[Si Vapor Pressure Space S2]
The same carburizing container 30 as in Example 1 was used.

(Growth Process)

The SiC substrate 10 arranged under the above conditions was grown under the same conditions as in Example 1.

Figure 6:
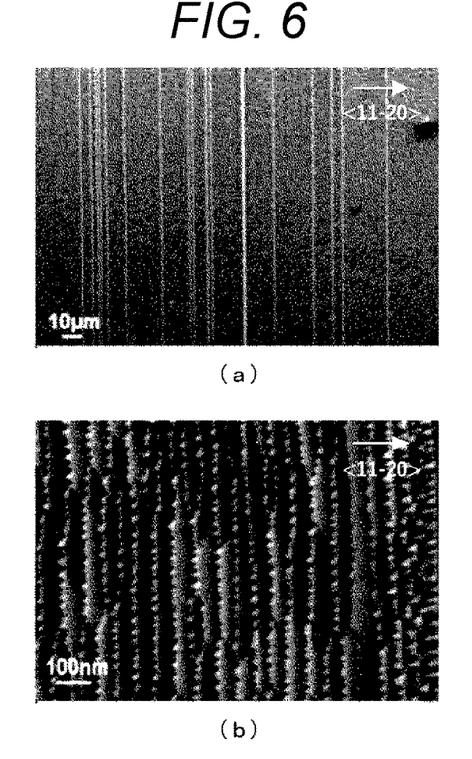
FIG. 6 is an SEM image of a SiC substrate surface observed in Comparative Example 1 of the manufacturing method of SiC semiconductor substrates according to one embodiment.

FIG. 6 is an SEM image of the surface of the SiC substrate 10 of Comparative Example 1 grown under the above conditions. FIG. 6(a) is an SEM image observed at a magnification of ×1000, and FIG. 6(b) is an SEM image observed at a magnification of ×100,000.

On the surface of the SiC substrate 10 of Comparative Example 1, the MSB having a zigzag-shaped step end is formed, and the steps 12 having a height of 3 nm are arranged with a terrace 13 width of average 42 nm. Incidentally, the height of the step 12 was measured by AFM.

Further, it is known from the relationship between the heating temperature and the growth rate that the growth environment in which the MSB is formed as in Comparative Example 1 is the SiC—C equilibrium vapor pressure environment (see FIG. 7).

FIG. 7 is a graph illustrating the relationship between the heating temperature and the growth rate in the growth by the manufacturing method of SiC semiconductor substrates according to the present invention. The horizontal axis of this graph is the reciprocal of temperature, and the vertical axis of this graph logarithmically represents the growth rate. The result of growth with setting the atomic number ratio Si/C in the supplying space for source material S1 to exceed 1 (see FIG. 2(a)) is indicated by ○, and the result of growth with setting the atomic number ratio Si/C in the supplying space for source material S1 to be 1 or less (see FIG. 3(a)) is indicated by X. Any surface of the SiC substrate 10 indicated by ○ was not formed with the MSB, and the step 12 had the height of one unit cell. On the other hand, all the surfaces of the SiC substrates 10 indicated by X were formed with the MSB.

In the graph of FIG. 7, the result of the thermodynamic calculation of SiC substrate growth in the SiC—Si equilibrium vapor pressure environment is indicated by a dashed line (Arrhenius plot), and the result of the thermodynamic calculation of SiC substrate growth in the SiC—C equilibrium vapor pressure environment is indicated by a two-dot chain line (Arrhenius plot).

That is, the dashed line indicates the result of thermodynamic calculation when single crystal SiC is grown with polycrystalline SiC as the source material in the vapor pressure environment in which three phases of SiC (solid phase), Si (liquid phase), and a gas phase are in equilibrium. Specifically, the thermodynamic calculation was performed under the following conditions (i) to (iv) using Equation 1. (i) A SiC+Si system with a constant volume, (ii) the growth driving force is the temperature gradient in the supplying space for source material S1 and the vapor pressure difference (chemical potential difference) between polycrystalline SiC and single crystal SiC, (iii) the source material gas is SiC, $SiC_2C$, and $SiC_2$, and (iv) the adsorption coefficient for adsorbing the source material into the step 12 is 0.001.

The two-dot chain line indicates the result of thermodynamic calculation when single crystal SiC is grown with polycrystalline SiC as the source material in the vapor pressure environment in which three phases of SiC (solid phase), C (solid phase), and a gas phase are in equilibrium. Specifically, the thermodynamic calculation was performed under the following conditions (i) to (iv) using Equation 1. (i) A SiC+C system with a constant volume, (ii) the growth driving force is the temperature gradient in the supplying space for source material S1 and the vapor pressure difference (chemical potential difference) between polycrystalline SiC and single crystal SiC, (iii) the source material gas is SiC, $SiC_2C$, and $SiC_2$, and (iv) the adsorption coefficient for adsorbing the source material into the step 12 is 0.001.

Incidentally, the values in the JANAF thermochemical table were adopted for the data of each chemical species used in the thermodynamic calculation.

As a result, it can be seen that under the conditions marked with ○ in FIG. 7 in which the SiC substrate 10 is grown in the SiC—Si equilibrium vapor pressure environment, the formation of MSB was decomposed and suppressed, and the steps 12 having the height of 1 nm (one unit cell) are aligned on the surface of the growth layer 11.

On the other hand, it can be seen that the MSB is formed under the conditions marked with X in FIG. 7 in which the SiC substrate 10 is grown in the SiC—C equilibrium vapor pressure environment.

According to the manufacturing method of SiC semiconductor substrates of the present invention, the growth process of growing the SiC substrate 10 in the SiC—Si equilibrium vapor pressure environment is included so that the growth layer 11 in which the steps 12 of the height of one unit cell are arranged can be grown.

REFERENCE SIGNS LIST

10 SiC substrate
11 Growth layer
12 Step
13 Terrace
20 Source material container
24 Si substrate
30 Carburizing container
40 High-temperature vacuum furnace
41 Main heating chamber
42 Preheating chamber
43 Moving unit
S1 Supplying space for source material
S2 Si vapor pressure space
MSB Macro step bunching

The invention claimed is:

1. A manufacturing method of SiC semiconductor substrates, the method comprising:
 a growth process that grows a SiC substrate while arranging steps having a height of one unit cell on a surface of the SiC substrate in a SiC—Si equilibrium vapor pressure environment.

2. The manufacturing method of SiC semiconductor substrates according to claim 1, wherein
 in the growth process, the SiC substrate is arranged and grown in a supplying space for source material which is evacuated through a Si vapor pressure space.

3. The manufacturing method of SiC semiconductor substrates according to claim 2, wherein
 in the growth process, a supplying source for Si atom and a supplying source for C atom are arranged for growth such that an atomic number ratio Si/C in the supplying space for source material exceeds 1.

4. The manufacturing method of SiC semiconductor substrates according to claim 1, wherein
 the growth process is performed at a temperature of 1600° C. or higher.

5. The manufacturing method of SiC semiconductor substrates according to claim 1, wherein
 in the growth process, the SiC—Si equilibrium vapor pressure environment is formed in a SiC container.

6. The manufacturing method of SiC semiconductor substrates according to claim 5, wherein
 in the growth process, the SiC—Si equilibrium vapor pressure environment is formed by placing the SiC substrate and a Si vapor supply source in the SiC container and heating them.

* * * * *